(12) United States Patent
Xu et al.

(10) Patent No.: US 10,225,907 B2
(45) Date of Patent: Mar. 5, 2019

(54) LIGHT EMITTING DEVICE HAVING AT LEAST TWO QUANTUM DOT LIGHT EMITTING LAYERS AND FABRICATING METHOD THEREOF

(71) Applicant: BOE TECHNOLOGY GROUP CO., LTD., Beijing (CN)

(72) Inventors: Wei Xu, Beijing (CN); Shi Shu, Beijing (CN); Xiaolong He, Beijing (CN); Jikai Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 15/533,144

(22) PCT Filed: May 12, 2016

(86) PCT No.: PCT/CN2016/081825
§ 371 (c)(1),
(2) Date: Jun. 5, 2017

(87) PCT Pub. No.: WO2017/140047
PCT Pub. Date: Aug. 24, 2017

(65) Prior Publication Data
US 2018/0054872 A1    Feb. 22, 2018

(30) Foreign Application Priority Data
Feb. 17, 2016 (CN) .......................... 2016 1 0089888

(51) Int. Cl.
*H01L 33/10* (2010.01)
*H01L 27/32* (2006.01)
(Continued)

(52) U.S. Cl.
CPC .............. *H05B 33/14* (2013.01); *C09K 11/02* (2013.01); *C09K 11/565* (2013.01);
(Continued)

(58) Field of Classification Search
CPC ....... H01L 33/14; H01L 33/10; H01L 27/305; H01L 27/3227; H01L 31/101;
(Continued)

(56) References Cited

U.S. PATENT DOCUMENTS

| 6,992,317 B2 * | 1/2006 | Jain ..................... B82Y 20/00 257/13 |
| 7,326,908 B2 * | 2/2008 | Sargent ................. B82Y 10/00 250/214.1 |

(Continued)

FOREIGN PATENT DOCUMENTS

| CN | 101461285 A | 6/2009 |
| CN | 101834249 A | 9/2010 |

(Continued)

OTHER PUBLICATIONS

International Search Report for Chinese International Application No. PCT/CN2016/081825 dated Nov. 25, 2016.
(Continued)

*Primary Examiner* — Ida M Soward
(74) *Attorney, Agent, or Firm* — Calfee, Halter & Griswold LLP

(57) ABSTRACT

A light emitting device, a fabricating method thereof, and a display device are disclosed. In the light emitting device, a light emitting functional layer includes at least two QD light emitting layers which emit light of different colors, and a transparent insulating layer which is arranged between any two neighboring QD light emitting layers. The light emitting device has a reduced power consumption, and the problem of shift in color of the emitted light due to high-energy excitons transfer is overcome.

19 Claims, 3 Drawing Sheets

(51) Int. Cl.
| | |
|---|---|
| *H01L 31/10* | (2006.01) |
| *H01L 51/50* | (2006.01) |
| *H01L 21/02* | (2006.01) |
| *C09K 11/02* | (2006.01) |
| *H05B 33/14* | (2006.01) |
| *C09K 11/56* | (2006.01) |
| *C09K 11/66* | (2006.01) |
| *C09K 11/88* | (2006.01) |
| *H01L 27/30* | (2006.01) |
| *H01L 31/101* | (2006.01) |
| *H01L 51/00* | (2006.01) |
| *H01L 51/42* | (2006.01) |
| *H01L 51/52* | (2006.01) |
| *H05B 33/10* | (2006.01) |
| *H01L 31/0352* | (2006.01) |

(52) U.S. Cl.
CPC .......... *C09K 11/661* (2013.01); *C09K 11/883* (2013.01); *H01L 27/305* (2013.01); *H01L 27/3227* (2013.01); *H01L 31/101* (2013.01); *H01L 51/0037* (2013.01); *H01L 51/426* (2013.01); *H01L 51/502* (2013.01); *H01L 51/5024* (2013.01); *H01L 51/5044* (2013.01); *H01L 51/52* (2013.01); *H05B 33/10* (2013.01); *H01L 21/02601* (2013.01); *H01L 31/035218* (2013.01); *Y10S 977/773* (2013.01); *Y10S 977/777* (2013.01)

(58) Field of Classification Search
CPC ......... H01L 31/035218; H01L 51/0037; H01L 51/426; H01L 51/5024; H01L 51/52; H01L 21/02601; C09K 11/02; C09K 11/565; C09K 11/661; C09K 11/883; Y10S 977/773–977/777
See application file for complete search history.

(56) References Cited

U.S. PATENT DOCUMENTS

| | | | | |
|---|---|---|---|---|
| 7,915,701 | B2* | 3/2011 | Forrest | B82Y 10/00 136/263 |
| 8,101,941 | B2* | 1/2012 | Choulis | B82Y 20/00 257/40 |
| 8,877,367 | B2* | 11/2014 | Holme | H01G 9/02 429/144 |
| 8,975,509 | B2* | 3/2015 | Barkhouse | H01L 51/42 136/255 |
| 9,054,330 | B2* | 6/2015 | Qian | H01L 51/502 |
| 9,318,632 | B2* | 4/2016 | Lewis | H01L 31/18 |
| 2005/0236556 | A1 | 10/2005 | Sargent et al. | |
| 2006/0188707 | A1 | 8/2006 | Khang et al. | |
| 2009/0242871 | A1 | 10/2009 | Kobayayashi et al. | |
| 2012/0113672 | A1* | 5/2012 | Dubrow | B82Y 20/00 362/602 |
| 2012/0274231 | A1* | 11/2012 | Tu | H01L 51/502 315/291 |
| 2013/0009131 | A1 | 1/2013 | Kazlas et al. | |
| 2015/0228850 | A1* | 8/2015 | Zheng | H01L 51/502 257/13 |
| 2015/0243849 | A1* | 8/2015 | Stroetmann | H01L 29/1606 257/13 |
| 2016/0072025 | A1* | 3/2016 | Skipor | B82Y 20/00 257/98 |
| 2016/0079316 | A1* | 3/2016 | Zhou | H01L 51/5278 257/13 |
| 2016/0233449 | A1* | 8/2016 | Murayama | C09K 11/565 |

FOREIGN PATENT DOCUMENTS

| | | |
|---|---|---|
| CN | 102047098 A | 5/2011 |
| CN | 102082215 A | 6/2011 |
| CN | 102723440 A | 10/2012 |
| CN | 103427030 A | 12/2013 |
| CN | 103545404 A | 1/2014 |
| CN | 103904178 A | 7/2014 |
| CN | 104263361 A | 1/2015 |
| CN | 105185919 A | 12/2015 |
| CN | 105552244 A | 5/2016 |
| KR | 20120061000 A | 6/2012 |
| KR | 20140007082 A * | 1/2014 |
| WO | 2012161179 A1 | 11/2012 |
| WO | 2013019030 A1 | 2/2013 |

OTHER PUBLICATIONS

First Office Action for Chinese Patent Application No. 201610089888.X dated Mar. 1, 2017.
Second Office Action for Chinese Patent Application No. 201610089888.X dated Sep. 13, 2017.
Third Office Action for Chinese Patent Application No. 201610089888.X dated Mar. 21, 2018.

* cited by examiner

LIGHT EMITTING DEVICE HAVING AT LEAST TWO QUANTUM DOT LIGHT EMITTING LAYERS AND FABRICATING METHOD THEREOF

RELATED APPLICATIONS

The present application is the U.S. national phase entry of PCT/CN2016/081825, with an international filing date of May 12, 2016, which claims the benefit of Chinese Patent Application 201610089888.X, filed on Feb. 17, 2016, the entire disclosures of which are incorporated herein by reference.

TECHNICAL FIELD

The present disclosure relates to the field of display technique, and particularly to a light emitting device, a fabricating method thereof, and a display device.

BACKGROUND

Quantum dots (QDs) have the advantages of a tunable wavelength of emitted light, a narrow wavelength range of emitted light (15-30 nm), excellent light, thermal and chemical stability, and ease of being formed by a solution method, so that they have been widely applied to QDs light-emitting diodes, (QLEDs). QLEDs not only have the unique optoelectronic advantages of QDs, but also can be formed by the well-established approach of forming a film in organic light-emitting diodes (OLEDs) from a solution. In this regard, QLEDs are expected to be applied to a new generation of flat display and lighting with high color quality and low power consumption, and thus are drawing increasing attention from the skilled in the art.

SUMMARY

Embodiments of the present disclosure provide a light emitting device, a fabricating method thereof, and a display device, which can reduce the power consumption of device, and can solve the problem of shift in color of the emitted light due to transferring of high-energy excitons in the light emitting device.

In an aspect, an exemplary embodiment of the present disclosure provides a light emitting device, comprising an anode, a cathode opposite to the anode, a hole transport layer close to the anode, an electron transport layer close to the cathode; a light emitting functional layer between the hole transport layer and the electron transport layer; the light emitting functional layer comprises: at least two QD light emitting layers which emit light of different colors; and a transparent insulating layer which is arranged between any two neighboring QD light emitting layers.

In an exemplary embodiment, the at least two QD light emitting layers which emit light of different colors comprise: a blue light QD light emitting layer and a yellow light QD light emitting layer; or, a blue light QD light emitting layer, a green light QD light emitting layer, and a red light QD light emitting layer.

In an exemplary embodiment, one of the anode and the cathode is a transparent electrode, the light emitted by the QD light emitting layer exits through the transparent electrode; as compared with the yellow light QD light emitting layer, the blue light QDs layer is arranged closer to the transparent electrode; or, as compared with the green light QD light emitting layer and the red light QD light emitting layer, the blue light QDs layer is arranged closer to the transparent electrode.

In an exemplary embodiment, the transparent insulating layer comprises at least one of polymethyl methacrylate (PMMA), $CsCO_3$ (cesium carbonate), $Ba(OH)_2$ (barium hydroxide).

In an exemplary embodiment, the transparent insulating layer has a thickness of 5-100 nm.

In an embodiment, the hole transport layer comprises at least one of poly[3,4-ethylenedioxythiophene]-Polystyrene sulfonic acid, NiO, $MoO_3$, $WO_3$, poly[9-vinylcarbazole monomer], poly[(9,9-dioctylfluorenyl-2,7-diyl)-co-(4,4'-(N-(4-sec-butyl phenyl)diphenylamine)], poly(N,N-bis(4-butylphenyl)-N,N-bisphenyl)benzidine, 4,4'-Bis(N-carbazolyl)-1,1'-biphenyl, and N,N'-Di(1-naphthyl)-N,N-diphenyl-(1,1'-biphenyl)-4,4'-diamine.

In an exemplary embodiment, the electron transport layer comprises at least a semiconductor material selected from $TiO_2$, ZnO and $SnO_2$; and/or, at least a semiconductor material selected from $TiO_2$, ZnO and $SnO_2$ which is doped with at least a metallic ion selected from Al, Mg and Ag.

In an exemplary embodiment, the blue light QD light emitting layer comprises at least a semiconductor nano-crystal selected from II-VI semiconductor nano-crystal, semiconductor nano-crystal, III-V semiconductor nano-crystal, and semiconductor nano-crystal.

In an exemplary embodiment, the yellow light QD light emitting layer comprises at least a semiconductor nano-crystal selected from II-VI semiconductor nano-crystal, semiconductor nano-crystal, III-V semiconductor nano-crystal, and semiconductor nano-crystal which is doped with at least a metallic ion selected from Cu, Mn, and Ag.

In another exemplary aspect, an embodiment of the present disclosure further provides a method for fabricating a light emitting device. The method comprises forming an anode, a hole transport layer, a light emitting functional layer, an electron transport layer and a cathode in this order. Forming the light emitting functional layer comprises: forming at least two QD light emitting layers which emit light of different colors; and forming a transparent insulating layer which is arranged between any two neighboring QD light emitting layers.

In an exemplary embodiment, the QD light emitting layers are formed by any one of spin coating, micro-contact printing, ink jet printing, and roll-to-roll printing.

In an exemplary embodiment, the anode is directly formed on the base plate; prior to forming the hole transport layer close to the anode, the method further comprises: performing a surface treatment on the anode, so that the anode has a surface profile arithmetic average Ra<2 nm, and/or a distance between the highest point and the lowest point in the surface profile of the anode Rmax<20 nm.

In an exemplary embodiment, the anode is directly formed on the base plate; prior to forming the hole transport layer close to the anode, the method further comprises: performing a plasma treatment and/or UV radiation treatment on the anode to increase work function of the anode.

In an exemplary embodiment, the cathode is directly formed on the base plate; prior to forming the electron transport layer close to the cathode, the method further comprises: performing a surface treatment on the formed cathode, so that the cathode has a surface profile arithmetic average Ra<2 nm, and/or a distance between the highest point and the lowest point in the surface profile of the cathode Rmax<20 nm.

In yet another exemplary aspect, an embodiment of the present disclosure further provides a display device, comprising any light emitting device as described above.

On basis of this, in the light emitting device according to exemplary embodiments of the present disclosure, since a transparent insulating layer is arranged between any two neighboring QD light emitting layers which emit light of different colors, high-energy excitons in a QD light emitting layer which emits light at a relatively short wavelength is not converted to low-energy excitons, and the light emitting effect of the QD light emitting layer is not weakened. This avoids the phenomenon of energy loss in the light emitting device, and increase in the power consumption is inhibited. Meanwhile, since the light emitting effect of the QD light emitting layer which emits light with the relatively short wavelength is not weakened, the original balance of the emitted light in the light emitting device (e.g., white balance of the white light emitted by white light QLEDs) will not be broken. This avoids the color shift phenomenon from occurring in the light emitting device, and the light emitting device has a good light emitting effect.

Since the transparent insulating layer is additionally arranged in the light emitting device, the problem of electric leakage which potentially occurs in the light emitting device in On-state is alleviated. Meanwhile, the transparent insulating layer is arranged between any two neighboring QD light emitting layers and acts as a buffer layer, so that during forming the subsequent QD light emitting layer, the transparent insulating layer can protect the underlying QD light emitting layer. During forming the subsequent QD light emitting layer by a solution method, this protects the preceding QD light emitting layer from being affected.

BRIEF DESCRIPTION OF THE DRAWINGS

In order to explain the technical solutions in the embodiments of the present disclosure or the prior art more clearly, the drawings to be used in the description of the embodiments or the prior art will be introduced briefly in the following, apparently, the drawings described below are only some embodiments of the present disclosure, the ordinary skilled person in the art, on the premise of not paying any creative work, can also obtain other drawings from these drawings.

DETAILED DESCRIPTION OF EMBODIMENTS

Figure 1:
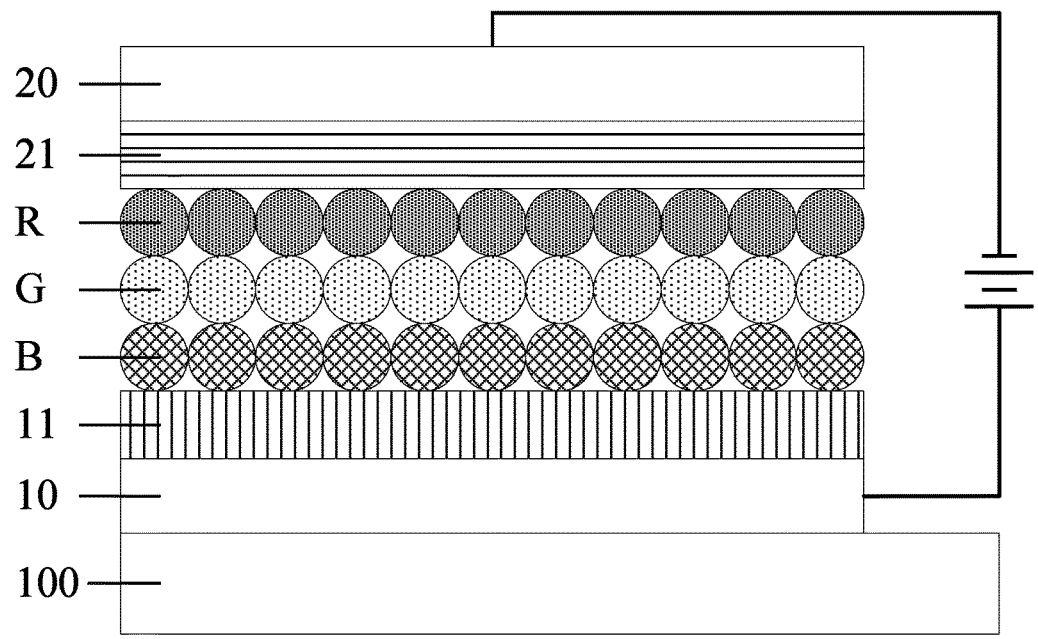
FIG. 1 is a cross-sectional view for illustrating a white light QLEDs light emitting device.

To make the objects, the technical solutions and the advantages of embodiments of the present disclosure more apparent, the technical solutions of the embodiments of the present disclosure will be described in detail hereinafter in conjunction with the drawings of the embodiments of the present disclosure. Apparently, the embodiments described hereinafter are only some embodiments of the present disclosure, but not all embodiments. Based the embodiments described hereinafter, other embodiments obtained by those skilled in the art should fall within the scope of the present disclosure.

Unless otherwise defined, the technical and scientific terms used in the present disclosure shall have the general meanings understandable for those ordinarily skilled in the field of the present disclosure. It is further noted that, unless otherwise defined, the terms as defined in the common dictionaries should be construed to have meaning which is consistent with the technical context, and should not be construed in an idealized or extremely formalized manner.

In description and claims of the present disclosure, direction or position relationships indicated by terms "above", "below" or the like are based on direction or position relationships shown in the accompanying drawings, are merely used to conveniently describe the present disclosure and simplify description, and are not used to indicate or imply that the indicated device or element must have a specific direction and be constructed and operated in a specific direction. Therefore, these terms shall not be construed as limitations to the present disclosure.

In addition, QDs involved in embodiments of the present disclosure have a very small size. For clarity, in the accompanying drawings for embodiments of the present disclosure, QDs are exaggerated in term of the size, and are not drawn to scale.

Reference numerals: 01—light emitting device; 100—base plate; 10—anode; 11—hole transport layer; 20—cathode; 21—electron transport layer; 30—light emitting functional layer; 31—QD light emitting layer; 32—transparent insulating layer.

The existing QLEDs are primarily applied to white light sources. As shown in FIG. 1, an QLED comprises: an anode 10, a hole transport layer (HTL) 11, a QD light emitting layer, an electron transport layer (ETL) 21, and a cathode 20 which are arranged on a base plate 100 in this order. The anode 10 and the cathode 20 can be exchanged in position, and the QLED shown in FIG. 1 is merely an example.

In a QLED shown in FIG. 1, a QD light emitting layer consists of three QD films of three colors, i.e., a R (Red) QD film, a G (Green) QD film and a B (Blue) QD film, which are arranged layer by layer. These layers are labeled as R, G and B, respectively. Since QDs which emit light of different colors are closely arranged, the phenomenon of energy transfer occurs. The blue light emitted by blue light QDs has a relatively short wavelength (430-470 nm), excitons formed by electrons and holes have a relatively high energy, and this energy tends to be transferred to green QDs (emitting green light in 500-560 nm) and red QDs (emitting red light in 620-780 nm) which emit light at a relatively long wavelength. The green light emitted by green light QDs has a shorter wavelength than red light, excitons formed by electrons and holes have a relatively high energy, and this energy also tends to be transferred to red QDs which emit light at a relatively long wavelength. As a result, the light emitted by green QDs or red QDs at a long wavelength is enhanced, while the light emitted by blue light QDs or green QDs at a relatively short wavelength is weakened. As a result of the above-mentioned conversion of high energy excitons to low-energy excitons, the phenomenon of energy loss occurs in white light QLEDs, which results in an increase in power consumption. Meanwhile, since the light emitted by blue light QDs or green QDs at a relatively short wavelength is weakened, the original balance of the emitted light is broken, a shift in color of light emitted by white light QLEDs, and the light emitting effect of the device is affected.

Figure 2:
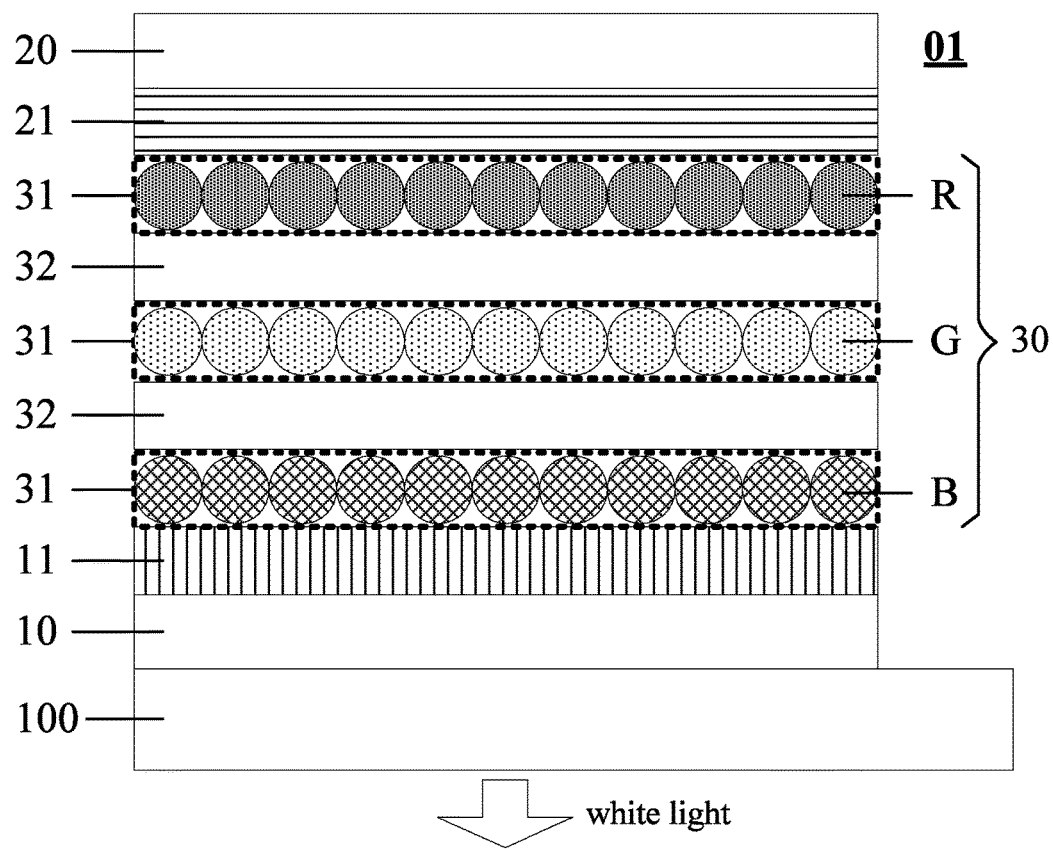
FIG. 2 is a cross-sectional view for illustrating a light emitting device in an embodiment of the present disclosure.
Figure 3:
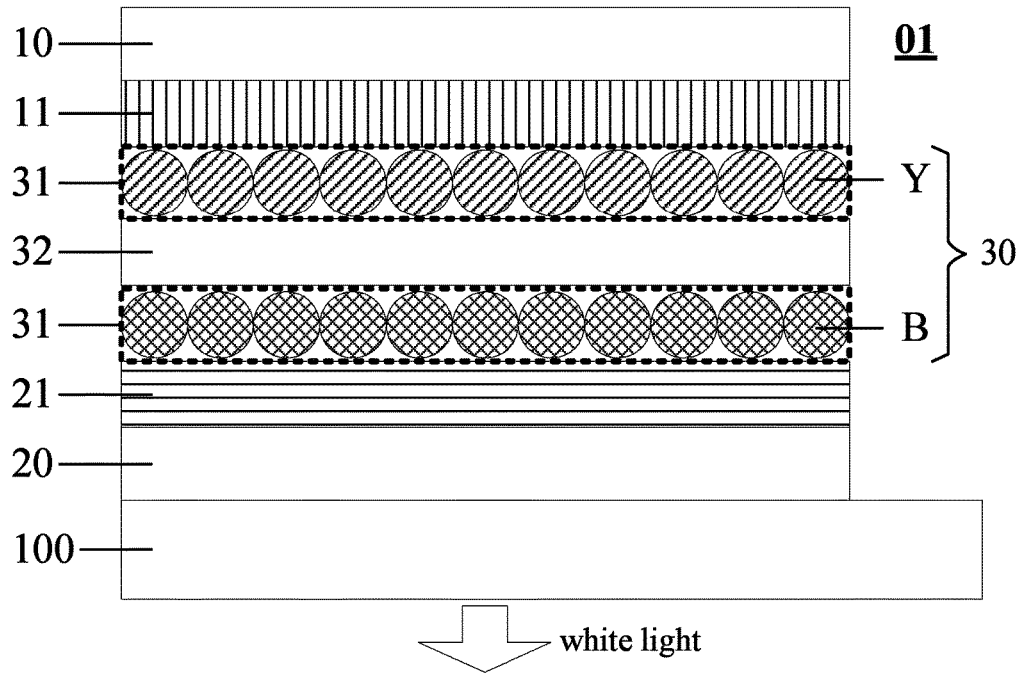
FIG. 3 is a cross-sectional view for illustrating a light emitting device in an embodiment of the present disclosure.

As shown in FIG. 2 and FIG. 3, in an embodiment of the present a light emitting device 01 is provided. The light emitting device 01 comprises: an anode 10 and a cathode 20 which are arranged oppositely, a hole transport layer 11 close to the anode 10, an electron transport layer 21 close to the cathode 20; and a light emitting functional layer 30 which is arranged between the hole transport layer 11 and the electron transport layer 21. The light emitting functional layer 30 comprises: at least two QD light emitting layers 31 which emit light of different colors; and a transparent insulating layer 32 which is arranged between any two neighboring QD light emitting layers 31.

It is noted that, the above-mentioned light emitting device 01 is an electroluminescent device. Apart from the transparent insulating layer 32, FIG. 2 only schematically illustrates a basic structure of the light emitting device 01, i.e., the anode 10, the cathode 20, the hole transport layer 11, the electron transport layer 21, and the QD light emitting layers 31.

As a carrier transport layer adjacent to the anode 10, the hole transport layer 11 comprises at least one of poly[3,4-ethylenedioxythiophene]-Polystyrene sulfonic acid (i.e., PEDOT-PSS), NiO (nickel oxide), $MoO_3$ (molybdenum trioxide), $WO_3$ (tungsten trioxide), poly[9-vinylcarbazole monomer] (i.e., PVK), poly[(9,9-dioctylfluorenyl-2,7-diyl)-co-(4,4'-(N-(4-sec-butyl phenyl)diphenylamine)], (i.e., TFB), poly(N,N'-bis(4-butylphenyl)-N,N-bisphenyl)benzidine (i.e., Poly-TPD), 4,4'-Bis(N-carbazolyl)-1,1'-biphenyl (i.e., CBP), N,N'-Di(1-naphthyl)-N,N-diphenyl-(1,1'-biphenyl)-4,4'-diamine (i.e., NPB), LG101 (a material for the hole transport layer available from LG corp. under Model 101). In an exemplary embodiment, the above materials with different ionization potentials ($I_p$) are combined to facilitate transferring of holes from the anode 10 to the light emitting functional layer 30.

As a carrier transport layer adjacent to the cathode 20, the electron transport layer 21 comprises: at least a semiconductor material of $TiO_2$ (titanium dioxide), ZnO (zinc oxide), $SnO_2$ (tin dioxide); and/or, at least a semiconductor material of $TiO_2$ (titanium dioxide), ZnO (zinc oxide), $SnO_2$ (tin dioxide) which is doped with at least a metallic ion selected from Al, Mg, and Ag.

Apart from the hole transport layer 11 and the electron transport layer 21, the light emitting device 01 further comprises for example an electron injection layer (EIL) and a hole injection layer (HIL), to improve light emitting efficiency.

The electron injection layer is arranged between the cathode 20 and the electron transport layer 21, and facilitates improving the efficiency of injecting electrons excited in the cathode 20 to the electron transport layer 21. In an example, the electron injection layer comprises Liq ((8-quinolinolato) lithium), or the like.

The hole injection layer is arranged between the anode 10 and the hole transport layer 11, and facilitates improving the efficiency of injecting holes excited in the anode 10 to the hole transport layer 11. In an example, the hole injection layer comprises CuPc (Copper (II) phthalocyanine), or the like.

In an exemplary embodiment, the light emitting functional layer 30 comprises at least two QD light emitting layers 31 which emit light of different colors. According to principles of optics, different colors of emitted light indicated different wavelength of emitted light. The at least two QD light emitting layers 31 which emit light of different colors certainly comprise a QD light emitting layer which emits light at a long wavelength and a QD light emitting layer which emits light at a relatively short wavelength. The transparent insulating layer 32 is arranged between any two neighboring QD light emitting layers 31 as mentioned above, and an insulating material can be deemed to have an infinite band gap. As a result, the transparent insulating layer 32 is capable of blocking excitons in the adjacent QD light emitting layer at one side which emits light at a short wavelength from transferring to the adjacent QD light emitting layer at the other side which emits light at a long wavelength.

Herein, reference is made to a case of a typical white light QLEDs light emitting device. According to principle of color mixing, in order to emit white light from the above-mentioned light emitting device 01, as shown in FIG. 2, the at least two QD light emitting layers 31 which emit light of different colors comprise a blue light QD light emitting layer (labeled by a letter B), a green light QD light emitting layer (labeled by a letter G), and a red light QD light emitting layer (labeled by a letter R). Namely, the blue, green and red light is combined into white light. The transparent insulating layer 32 which is arranged between the blue light QD light emitting layer and the green light QD light emitting layer blocks high-energy excitons in the blue light QD light emitting layer from transferring energy to the green light QD light emitting layer and the red light QD light emitting layer. Similarly, the transparent insulating layer 32 which is arranged between the green light QD light emitting layer and the red light QD light emitting layer blocks high-energy excitons in the green light QD light emitting layer from transferring energy to the red light QD light emitting layer.

In an alternative embodiment, as shown in FIG. 3, at least two QD light emitting layers 31 which emit light of different colors comprises a blue light QD light emitting layer (labeled by a letter B) and a yellow light QD light emitting layer (labeled by a letter Y, wherein the wavelength of yellow light lies in 560-620 nm, which is larger than that of the blue light). Namely, the blue light and the yellow light are combined into white light. The transparent insulating layer 32 which is arranged between the blue light QD light emitting layer and the yellow light QD light emitting layer blocks high-energy excitons in the blue light QD light emitting layer from transferring energy to the yellow light QD light emitting layer.

In an exemplary embodiment, the transparent insulating layer 32 comprises an organic material, such as PMMA. In other embodiments, the transparent insulating layer 32 comprises an inorganic material, such as $CsCO_3$ and $Ba(OH)_2$.

The transparent insulating layer 32 has a thickness which can be set flexibly according to the process for fabricating the light emitting device 01. In case the transparent insulating layer 32 is relatively thin, its effect for blocking high energy excitons transfer may be limited. In case the transparent insulating layer 32 is relatively thick, the device will have a large thickness, and this is unfavorable in term of current design requirements for a lighter and thinner light emitting device for purpose of display and/or lighting. Thus, in an exemplary embodiment, the transparent insulating layer 32 has a thickness of 5-100 nm.

In the light emitting device 01 according to embodiments of the present disclosure, the transparent insulating layer 32 is arranged between any two neighboring QD light emitting layers 31 which emit light of different colors, so that high-energy excitons in the QD light emitting layer which emits light at a relatively short wavelength will not be converted to low-energy excitons. As a result, the light emitting effect of the QD light emitting layer which emits light at a relatively short wavelength will not be weakened, which avoids the phenomenon of energy loss from occurring in the light emitting device, and inhibits increase in the power consumption. Meanwhile, since the light emitting effect of the QD light emitting layer which emits light at a relatively short wavelength is not weakened, the original balance of the emitted light in the light emitting device (e.g., white balance of white light emitted by white light QLEDs) will not be broken. This avoids the phenomenon of color shift in the light emitting device (e.g., in white light QLEDs of the prior art, due to transferring of high energy excitons, the white light is yellowish). As a result, it is ensured that the light emitting device has a good light emitting effect.

In the light emitting device 01, the transparent insulating layer 32 is capable of alleviating the potential problem of electric leakage when the light emitting device is in On-state. Meanwhile, the transparent insulating layer 32 is arranged between any two neighboring QD light emitting layers 31 and acts as a buffer layer, so that it can protect QD light emitting layers 31 below the transparent insulating layer 32 during forming the subsequent QD light emitting layers 31, and the effect on the preceding QD light emitting layers 31 is avoided during forming the subsequent QD light emitting layers 31 by the solution method.

White light QLEDs are mainstream light sources for the backlight source in the current display device. In an embodiment of the present disclosure, the light emitting device 01 comprises white light QLEDs. In the light mixing mode where a blue light QD light emitting layer, a green light QD light emitting layer, and a red light QD light emitting layer are used, QD light emitting layers of three colors are required, and accordingly two transparent insulating layers 32 are required. The device structure is relatively complicated, and more processes are involved. In an exemplary embodiment, the light emitting device 01 comprises two QD light emitting layers which emit light of different colors, and these two QD light emitting layers comprises a blue light QD light emitting layer and a yellow light QD light emitting layer. In this way, white light is obtained by mixing color of two colors. Meanwhile, it is only necessary to form one transparent insulating layer 32, so that the device structure is relatively simple and fewer processed are involved.

Herein, QDs in the blue light QD light emitting layer comprise: at least a semiconductor nano-crystal selected from II-VI semiconductor nano-crystal, semiconductor nano-crystal, III-V semiconductor nano-crystal, and semiconductor nano-crystal.

The II-VI semiconductor nano-crystal, semiconductor nano-crystal, III-V semiconductor nano-crystal, and semiconductor nano-crystal comprise a shell/core structure nano-crystal of ane one of CdSe/ZnS, CdS/ZnS, CdTe/CdSe/ZnS, ZnCdS/ZnS, ZnSe/ZnS, ZnTe/ZnSe/ZnS, HgTe/CdSe, ZnInS/ZnS, InP/ZnSe/ZnS, InAs/CdS/ZnS, GaAs/CdS/ZnS, CuInS$_2$/ZnS, AgInS$_2$/ZnS, ZnInS$_2$/ZnS.

Currently the QD light emitting layer is mainly formed by approaches of forming a film from a solution, such as spin coating, micro-contact printing, ink jet printing, and roll-to-roll printing. In these approaches, QDs are dispersed in a solvent, and a film is formed on a substrate by a film forming process. Then the solvent is removed to produce a single layer or multi-layer QD light emitting layer. In the micro-contact printing, a pattern formed is formed on a base plate, and then the pattern is transferred onto a target substrate by a pattern transferring technique.

For the purpose that QDs are uniformly dispersed in the solvent and facilitates forming a uniform film and avoid agglomeration, the surface of QDs is provided with ligands according to the solvent. For example, in case the solvent is an organic solvent, the surface of QDs is modified by lipophilic organic ligands, such as oleic acid, oleylamine. In this case, QDs are in an oil phase. In case the solvent is water, the surface of QDs is modified by hydrophilic organic ligands, such as mercaptopropionic acid. In this case, QDs are in an aqueous phase.

In film forming processes like spin coating and micro-contact printing, the solvent for example is one of pure water, ethanol, n-hexane, octane, methylbenzene, chlorobenzene, and m-xylene.

In film forming processes like ink jet printing and roll-to-roll printing, the solvent for example comprises two or more of pure water, ethanol, diethylene glycol, and glycerol. In an alternative embodiment, the solvent comprises two or more n-hexane, cyclohexane, octane, methylbenzene, chlorobenzene, and m-xylene.

Details for the above approaches of forming a film from a solution can be found in the prior art, and embodiments of the present disclosure are not restricted in this regard.

Herein, QDs in the yellow light QD light emitting layer comprise at least a semiconductor nano-crystal selected from II-VI semiconductor nano-crystal, semiconductor nano-crystal, III-V semiconductor nano-crystal, and semiconductor nano-crystal which is doped with at least a metallic ion selected from Cu, Mn, and Ag. The types of II-VI, III-V, semiconductor nano-crystal have been described above, which is not repeated herein simplicity.

In an exemplary embodiment, one of the anode 10 and the cathode 20 is a transparent electrode, and the light emitted in the light emitting device 01 exits through the transparent electrode. As shown in FIG. 3, as compared with the yellow light QD light emitting layer, the blue light QDs layer is arranged close to the transparent electrode (the cathode 20). In an alternative embodiment, as shown in FIG. 2, as compared with the green light QD light emitting layer and the red light QD light emitting layer, the blue light QDs layer is arranged close to the transparent electrode (the anode 10).

The transparent electrode comprises for example any one f ITO (Indium Tin Oxide), IZO (Indium Zinc Oxide), FTO (Fluorine-Doped Tin Oxide).

The blue light QD light emitting layer emits blue light at a relatively short wavelength with high energy, and has a relatively short lifetime over the yellow light QD light emitting layer, the green light QD light emitting layer and the red light QD light emitting layer. By arranging the blue light QD light emitting layer close to the electrode at the light exit side of the light emitting device 01, it is possible to avoid the blue light emitted by the blue light QD light emitting layer is absorbed by the yellow light QD light emitting layer, the green light QD light emitting layer, or the red light QD light emitting layer, thus increasing the blue light emitting efficiency of the device.

In an embodiment of the present disclosure, it is further provided a method for fabricating the light emitting device 01. The method comprises: forming the anode 10, the hole transport layer 11, the light emitting functional layer 30, the electron transport layer 21, and the cathode 20 in this order; and a step of forming the light emitting functional layer 30 comprises: forming at least two QD light emitting layers 31 which emit light of different colors; and forming the transparent insulating layer 32 between any two neighboring QD light emitting layers 31.

The above-mentioned QD light emitting layers 31 for example are formed by any one of method selected from spin coating, micro-contact printing, ink jet printing, and roll-to-roll printing.

In case the light emitting device 01 is a positively stacked light emitting device, the anode 10 is directly formed on the base plate 100, and accordingly the cathode 20 is formed over the anode 10.

Prior to forming the hole transport layer 11 close to the anode 10, the above method further comprises: performing a surface treatment on the formed anode 10, so that the anode 10 has a surface roughness Ra<2 nm, and/or the anode 10 has a surface roughness Rmax<20 nm.

It is noted that, the above-mentioned surface roughness Ra indicates an arithmetic average of surface profile within a test area, and the surface roughness Rmax indicates a distance between the highest point and the lowest point in surface profile within a test area.

After the surface treatment, the anode 10 has a surface roughness Ra<2 nm, and/or a surface roughness Rmax<20 nm. This helps to improve adhesion force for a layer which will be formed subsequently, e.g., the hole transport layer 11. This also helps to decrease surface defects due to a rough surface of the anode 10, thus avoiding any effect on the light emitting performance of the device.

In an exemplary embodiment, the base plate 100 is a glass substrate. In other embodiments, the base plate 100 is a COA substrate (color filter on array substrate, i.e., a substrate in which a thin film transistor array and a color filter layer are integrated). In this case, the above-mentioned light emitting device 01 is integrated in the COA substrate. The structure of the base plate 100 can be flexibly modified according to the structure of the display and/or lighting device to which the light emitting device 01 is applied, and embodiments of the present disclosure are not restricted in this regard.

In an exemplary embodiment, prior to forming the hole transport layer 11 close to the anode 10, the above method further comprises: performing plasma treatment and/or UV (ultraviolet) radiation treatment on the formed anode 10, to increase work function of the anode 10, decrease the hole injection barrier, and improve the light emitting efficiency.

In case the light emitting device 01 is a flip-chip light emitting device, the cathode 20 is directly formed on the base plate 100, and accordingly the anode 10 is formed over the cathode 20.

Prior to forming the electron transport layer 21 close to the cathode 20, the above method further comprises: performing a surface treatment on the formed cathode 20, so that the cathode 20 has a surface roughness Ra<2 nm, and/or the cathode 20 has a surface roughness Rmax<20 nm. As a result, adhesion force for a layer which will be formed subsequently, e.g., the electron transport layer 21, is improved. The surface defects due to a rough surface of the cathode 20 are decreased, which avoids any effect on the light emitting performance of the device.

Among embodiments of the present disclosures, the following two exemplary embodiments are described for understanding the process for fabricating the above light emitting device 01.

First Exemplary Embodiment

Figure 4:
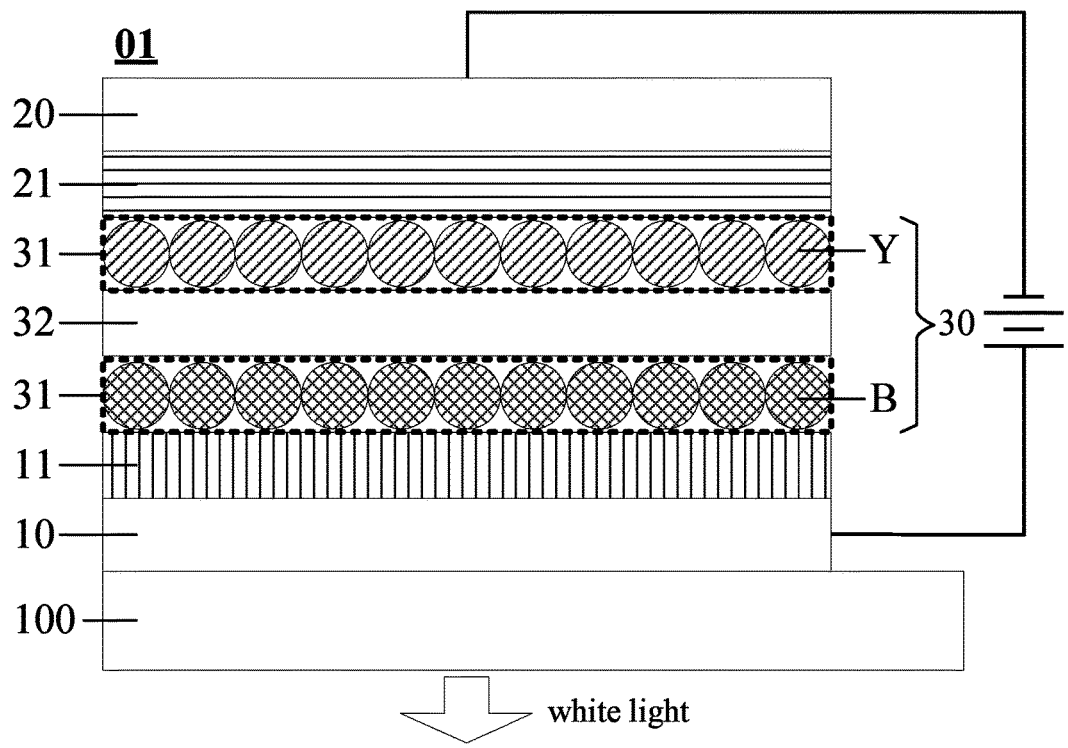
FIG. 4 is a cross-sectional view for illustrating a light emitting device in a first exemplary embodiment of the present disclosure.

In the first exemplary embodiment, it is provided a method for fabricating a positively stacked white light QLED shown in FIG. 4. The method comprises the following steps.

Step S101, forming the anode 10 on the base plate 100.

An ITO layer is deposited on the base plate 100 of a transparent glass by magnetron sputtering. The ITO layer acts as a transparent anode (with a transmittance about 90%), and has a thickness of 70-150 nm. The ITO layer is subject to annealing at a suitable temperature, so that the sheet resistance (i.e., square resistance) is decreased to 10-40Ω/□ (the symbol "□" indicates a square).

The anode 10 is further subject to a surface treatment by mechanical polishing, so that it has a surface roughness Ra<2 nm and Rmax<20 nm. Then the anode 10 is subject to plasma treatment (with a duration about 2 mins) or UV radiation (with a duration about 15 mins), to increase work function of ITO (up to 4.8 eV) and decrease hole injection barrier.

Step S102, forming the hole transport layer 11 on the anode 10.

For example, the hole transport layer 11 is formed by a film forming process, such as coating, spin coating, ink jet printing or roll-to-roll printing, and has a thickness of 10-150 nm. The hole transport layer is annealed in the air at a temperature of 150° C., and kept at this temperature for 15 mins. The hole transport layer 11 is made from the material as described above, which is not repeated for simplicity.

Step S103, forming the blue light QD light emitting layer on the hole transport layer 11.

For example, the blue light QD light emitting layer is formed by a film forming process such as spin coating, micro-contact printing, ink jet printing or roll-to-roll printing, and has a thickness of 10-60 nm. The blue light QD light emitting layer is made from the material as described above, which is not repeated for simplicity.

Step S104, forming the transparent insulating layer 32 on the blue light QD light emitting layer.

For example, the transparent insulating layer 32 is formed by a film forming process such as coating, spin coating, ink jet printing or roll-to-roll printing, and has a thickness of 5-100 nm. The transparent insulating layer 32 is made from the material as described above, which is not repeated for simplicity.

Step S105, forming a yellow light QD light emitting layer on the transparent insulating layer 32.

For example, the above-mentioned yellow light QD light emitting layer is formed by a film forming process such as spin coating, micro-contact printing, ink jet printing or roll-to-roll printing, and has a thickness of 10-60 nm. The yellow light QD light emitting layer is made from the material as described above, which is not repeated for simplicity.

Step S106, forming the electron transport layer 21 on the yellow light QD light emitting layer.

For example, the electron transport layer 21 is formed by a film forming process such as coating, spin coating, ink jet printing, roll-to-roll printing and evaporation, and has a thickness of 10-100 nm. The electron transport layer 21 is made from the material as described above, which is not repeated for simplicity.

Step S107, forming the cathode 20 on the electron transport layer 21.

A metallic layer is formed on the electron transport layer 21 by evaporation, and acts as a reflective cathode to improve light extraction efficiency of a bottom emitting device. The metallic layer has a thickness of 50-150 nm, and is made from a metallic and highly reflective material such as Al, Ag, and Mg.

Second Exemplary Embodiment

Figure 5:
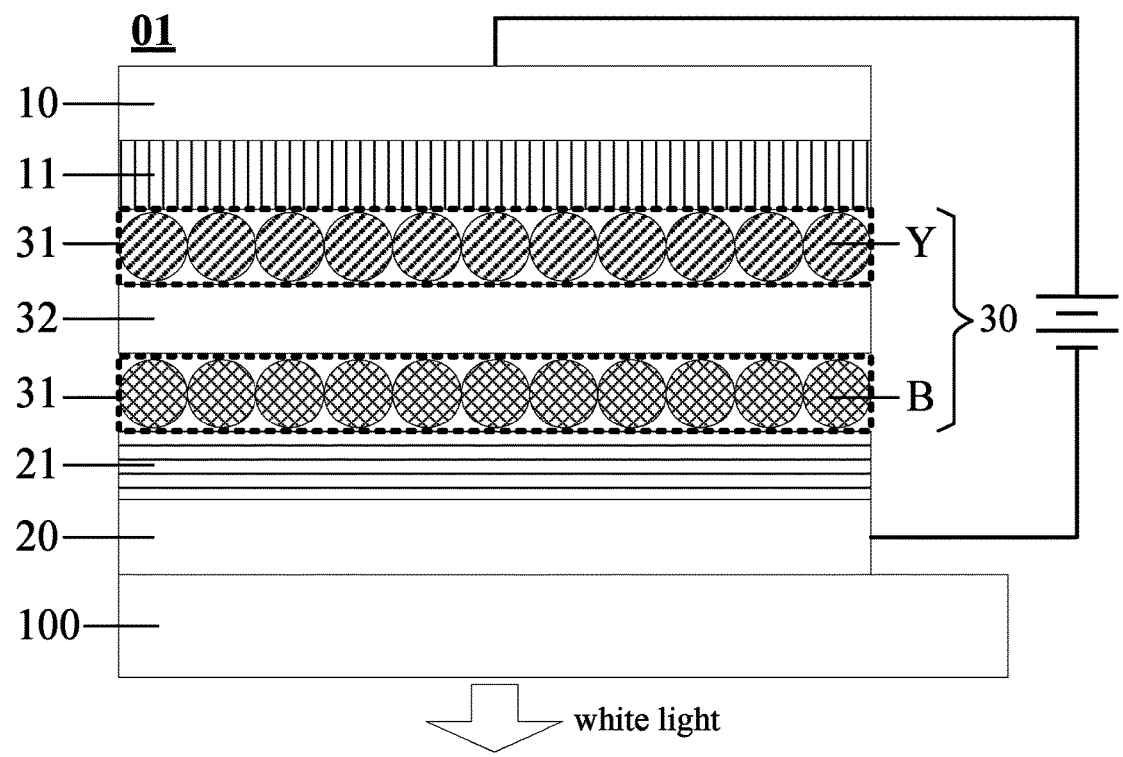
FIG. 5 is a cross-sectional view for illustrating a light emitting device in a second exemplary embodiment of the present disclosure.

In the second exemplary embodiment, it is provided a method for fabricating a flip-chip white light QLED shown in FIG. 5. The method comprises the following steps.

Step S201, forming the cathode 20 on the base plate 100.

An ITO layer is deposited on the base plate 100 of a transparent glass by magnetron sputtering. The ITO layer acts as a transparent cathode (with a transmittance about 90%), and has a thickness of 70-150 nm. The ITO layer is subject to annealing at a suitable temperature, so that the sheet resistance is decreased to 10-40 Ω/□.

The anode 10 is further subject to a surface treatment by mechanical polishing, so that it has a surface roughness Ra<2 nm and Rmax<20 nm. Then the anode 10 is subject to plasma treatment (with a duration about 2 mins) or UV radiation (with a duration about 15 mins), to increase work function of ITO and decrease electron injection barrier.

Step S202, forming the electron transport layer 21 on the cathode 20.

For example, the electron transport layer 21 is formed by a film forming process such as coating, spin coating and ink jet printing, and has a thickness of 10-100 nm. The electron transport layer 21 is made from the material as described above, which is not repeated for simplicity.

Step S203, forming the blue light QD light emitting layer on the electron transport layer 21.

For example, the blue light QD light emitting layer is formed by a film forming process such as spin coating, micro-contact printing, ink jet printing, and roll-to-roll printing, and has a thickness of 10-60 nm. The blue light QD light emitting layer is made from the material as described above, which is not repeated for simplicity.

Step S204, forming the transparent insulating layer 32 on the blue light QD light emitting layer.

For example, the transparent insulating layer 32 is formed by a film forming process such as coating, spin coating and ink jet printing, and has a thickness of 5-100 nm. The transparent insulating layer 32 is made from the material as described above, which is not repeated for simplicity.

Step S205, forming the yellow light QD light emitting layer on the transparent insulating layer 32.

For example, the yellow light QD light emitting layer is formed by a film forming process such as spin coating, micro-contact printing, ink jet printing, and roll-to-roll printing, and has a thickness of 10-60 nm. The yellow light QD light emitting layer is made from the material as described above, which is not repeated for simplicity.

Step S206, forming the hole transport layer 11 on the yellow light QD light emitting layer.

For example, the hole transport layer 11 is formed by a approach of forming a film from a solution or by evaporation, and has a thickness of 10-150 nm. The hole transport layer 11 is made from the material as described above, which is not repeated for simplicity.

Step S207, forming the anode 10 on the hole transport layer 11.

A metallic layer is formed on the hole transport layer 11 by evaporation, and acts as a reflective anode to improve light extraction efficiency of a bottom emitting device. The metallic layer has a thickness of 50-150 nm, and is made from a metallic and highly reflective material such as Al, Ag, and Mg.

It is noted that in the first and second exemplary embodiments, a bottom emitting type white light QLED has been described. The above technical solutions in embodiments of the present disclosure are applicable to both a top emitting type and a two-side emitting type white light QLED.

An embodiment of the present disclosure further provides a display device, comprising the light emitting device 01 as described above. The display device for example is any product or component with a display function like a liquid crystal display, a liquid crystal TV, a digital photo frame, a mobile phone, and a tablet computer.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A light emitting device comprising:
   an anode,
   a cathode arranged opposite to the anode,
   a hole transport layer arranged close to the anode,
   an electron transport layer arranged close to the cathode,
   a light emitting functional layer arranged between the hole transport layer and the electron transport layer,
   wherein the light emitting functional layer comprises at least two quantum dot (QD) light emitting layers which emit light of different colors; and
   a transparent insulating layer arranged between any two neighboring QD light emitting layers.

2. The light emitting device of claim 1, wherein among the at least two QD light emitting layers which emit light of different colors, as compared with a QD light emitting layer which emits light at a relatively long wavelength, a QD light emitting layer which emits light at a relatively short wavelength is arranged closer to a light exit side of the light emitting device.

3. The light emitting device of claim 2, wherein the at least two QD light emitting layers which emit light of different colors comprise a blue light QD light emitting layer and a yellow light QD light emitting layer.

4. The light emitting device of claim 3, wherein as compared with the yellow light QD light emitting layer, the blue light QDs layer is arranged closer to the light exit side.

5. The light emitting device of claim 2, wherein the at least two QD light emitting layers which emit light of different colors comprise a blue light QD light emitting layer, a green light QD light emitting layer, and a red light QD light emitting layer.

6. The light emitting device of claim 5, wherein as compared with the green light QD light emitting layer and the red light QD light emitting layer, the blue light QDs layer is arranged closer to the light exit side.

7. The light emitting device of claim 1, wherein one of the anode and the cathode is a transparent electrode, and the light emitted by the QD light emitting layer exits through the transparent electrode.

8. The light emitting device of claim 1, wherein the transparent insulating layer comprises at least one of PMMA, $CsCO_3$, $Ba(OH)_2$.

9. The light emitting device of claim 1, wherein the transparent insulating layer has a thickness of about 5-100 nm.

10. The light emitting device of claim 1, wherein the hole transport layer comprises at least one of poly[3,4-ethylene-dioxythiophene]-Polystyrene sulfonic acid, NiO, $MoO_3$, $WO_3$, poly[9-vinylcarbazole monomer], poly[(9,9-dioctyl-fluorenyl-2,7-diyl)-co-(4,4'-(N-(4-sec-butyl phenyl)diphe-nylamine)], poly(N,N'-bis(4-butylphenyl)-N,N'-bisphenyl) benzidine, 4,4'-Bis(N-carbazolyl)-1,1'-biphenyl, and N,N'-Di(1-naphthyl)-N,N'-diphenyl-(1,1'-biphenyl)-4,4'-diamine.

11. The light emitting device of claim 1, wherein the electron transport layer comprises at least a semiconductor material selected from $TiO_2$, ZnO and $SnO_2$; or at least a semiconductor material selected from $TiO_2$, $ZnO$ and $SnO_2$ which is doped with at least a metallic ion selected from Al, Mg and Ag.

12. The light emitting device of claim 3, wherein the blue light QD light emitting layer comprises at least a semiconductor nano-crystal selected from II-VI semiconductor nano-crystal, semiconductor nano-crystal, III-V semiconductor nano-crystal, and semiconductor nano-crystal.

13. The light emitting device of claim 3, wherein the yellow light QD light emitting layer comprises at least a semiconductor nano-crystal selected from II-VI semiconductor nano-crystal, semiconductor nano-crystal, III-V semiconductor nano-crystal, and semiconductor nano-crystal which is doped with at least a metallic ion selected from Cu, Mn, and Ag.

14. A display device comprising: the light emitting device of claim 1.

15. A method for fabricating a light emitting device comprising: forming an anode, a hole transport layer, a light emitting functional layer, an electron transport layer and a cathode in this order, wherein forming the light emitting functional layer comprises forming at least two quantum dot (QD) light emitting layers which emit light of different colors; and forming a transparent insulating layer which is arranged between any two neighboring QD light emitting layers.

16. The method of claim 15, wherein the QD light emitting layers are formed by any one of spin coating, micro-contact printing, ink jet printing, and roll-to-roll printing.

17. The method of claim 15, wherein the anode is directly formed on the base plate, and prior to forming the hole transport layer close to the anode, the method further comprises:

performing a surface treatment on the anode, so that the anode has a surface profile arithmetic average Ra<2 nm or a distance between the highest point and the lowest point in the surface profile of the anode Rmax<20 nm.

18. The method of claim 15, wherein the anode is directly formed on the base plate, and prior to forming the hole transport layer close to the anode, the method further comprises:

performing a plasma treatment or UV radiation treatment on the anode to increase work function of the anode.

19. The method of claim 15, wherein the cathode is directly formed on the base plate, and prior to forming the electron transport layer close to the cathode, the method further comprises:

performing a surface treatment on the formed cathode, so that the cathode has a surface profile arithmetic average Ra<2 nm or a distance between the highest point and the lowest point in the surface profile of the cathode Rmax<20 nm.

* * * * *